(12) United States Patent
Suga

(10) Patent No.: US 9,153,474 B2
(45) Date of Patent: Oct. 6, 2015

(54) SEMICONDUCTOR DEVICE MANUFACTURING METHOD

(71) Applicant: Sharp Kabushiki Kaisha, Osaka (JP)

(72) Inventor: Katsuyuki Suga, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/385,756

(22) PCT Filed: Mar. 11, 2013

(86) PCT No.: PCT/JP2013/056578
§ 371 (c)(1),
(2) Date: Sep. 16, 2014

(87) PCT Pub. No.: WO2013/141052
PCT Pub. Date: Sep. 26, 2013

(65) Prior Publication Data
US 2015/0041947 A1     Feb. 12, 2015

(30) Foreign Application Priority Data

Mar. 22, 2012  (JP) ................... 2012-066195

(51) Int. Cl.
*H01L 21/30*   (2006.01)
*H01L 21/46*   (2006.01)
(Continued)

(52) U.S. Cl.
CPC ...... *H01L 21/76254* (2013.01); *H01L 27/1203* (2013.01); *H01L 27/1218* (2013.01); *H01L 27/1266* (2013.01)

(58) Field of Classification Search
CPC .............. H01L 21/46; H01L 21/76254; H01L 21/6835; H01L 21/76259; H01L 21/775

USPC ........................................ 438/458; 257/506
See application file for complete search history.

(56) References Cited

U.S. PATENT DOCUMENTS

2003/0003687 A1 *  1/2003  Yanagita et al. ............... 438/458
2006/0205180 A1    9/2006  Henley et al.
(Continued)

FOREIGN PATENT DOCUMENTS

| JP | 2008-532317 A | 8/2008 |
| JP | 2009-194400 A | 8/2009 |
| WO | 2006/093817 A2 | 9/2006 |

OTHER PUBLICATIONS

Sullivan et al., "Layer-Transfer of Silicon Single-Crystal Films on Large-Area Glass Substrates for Mobile Display Applications", SID Symposium Digest of Technical Papers, Jun. 2006, vol. 37, Issue 1, pp. 280-282.

(Continued)

*Primary Examiner* — Phuc Dang
(74) *Attorney, Agent, or Firm* — Chen Yoshimura LLP

(57) ABSTRACT

An objective of the present invention is to increase production efficiency of high-performance flexible semiconductor devices. A semiconductor device manufacturing method includes: a step of forming an insulating substrate (10) which is configured of glass substrates (11, 13) with a thermal expansion coefficient which approximates the thermal expansion coefficient of a single-crystal silicon substrate (20) and a plastic substrate (12) which is positioned between both of the glass substrates; and a step of, after bonding the insulating substrate (10) with the single-crystal silicon substrate (20), separating a portion of the single-crystal silicon substrate (20) with heat processing, and forming a single-crystal silicon layer (14) upon the glass substrate (11).

12 Claims, 11 Drawing Sheets

(51) Int. Cl.
*H01L 21/762* (2006.01)
*H01L 27/12* (2006.01)

(56) References Cited

U.S. PATENT DOCUMENTS

| | | |
|---|---|---|
| 2006/0211219 A1 | 9/2006 | Henley et al. |
| 2008/0061452 A1* | 3/2008 | Nishihata et al. ............. 257/798 |
| 2008/0261379 A1* | 10/2008 | Jinbo et al. .................... 438/458 |
| 2011/0201177 A1* | 8/2011 | Fournel et al. ................ 438/458 |

OTHER PUBLICATIONS

Couillard et al., "Comparison of Corning Silicon-on-Glass Technology and ELA Poly-Si TFT Uniformity Performance", IDW09, p. 261-p. 264.

Huang et al., "A 4.1-inch Flexible QVGA AMOLED using a Microcrystalline-Si:H TFT on a Polyimide Substrate", SID Symposium Digest of Technical Papers, Jun. 2009, vol. 40, Issue 1, pp. 866-869.

Lo et al., "Flexible Glass Substrates for Organic TFT Active Matrix Electrophoretic Displays", SID Symposium Digest of Technical Papers, Jun. 2011, vol. 42, Issue 1, pp. 387-388.

* cited by examiner (a)

(b)

(c)

(d)

(e)

(a)

(b)

(c)

(d)

(e)

(f)

(a) Case in which both glass substrates are thin (b) Case in which glass substrate on non-bonding surface is thick (a)

(b)

(c)

(d)

SEMICONDUCTOR DEVICE MANUFACTURING METHOD

TECHNICAL FIELD

The present invention relates to a semiconductor device having thin-film transistors (TFT) used in liquid crystal display devices, for example, on top of a glass substrate.

BACKGROUND ART

Currently, low temperature polysilicon is mainstream for TFTs in mid-to small-sized liquid crystal display devices, but low temperature polysilicon has a small grain size, low mobility, and varies a lot in TFT characteristics. In order to improve TFT characteristics, single-crystal silicon (Si) with no crystal grain boundary may be formed, but it is difficult to form single-crystal silicon on top of a large substrate using a regular film forming method. A technology to transfer a single-crystal silicon wafer to a top of a glass substrate is being studied (see Non-Patent Documents 1 and 2).

Furthermore, while efforts have been made in improving TFT performance, the development of a flexible display that has a curved surface and flexible characteristics has also been taking place (see Non-Patent Document 3). In order to realize a flexible display, a plastic substrate such as PET can be used as a substrate that is flexible, but a regular plastic substrate only has an upper temperature limit of approximately 100° C., so the TFT characteristics decrease. Furthermore, if a polyimide (PI) or the like is used as a flexible substrate, then the upper temperature limit is approximately 400° C., so low temperature polysilicon can be formed, but it is still not enough to obtain high TFT performance.

Furthermore, if a single-crystal silicon film can be transferred to the top of the flexible substrate, then even higher performing flexible displays can be realized, but for transferring the single-crystal silicon wafer, heat treatment of over several hundred degrees Celsius is necessary. However, the coefficient of thermal expansion of a plastic substrate made of PET, PI, or the like and a silicon wafer is highly different, and the plastic substrate bends during heat treatment, and thus the single-crystal silicon wafer cannot be reliably transferred.

Recently, a thin film glass with a thickness of 100 um or less that can be bent has been reported (Non-Patent Document 4), but such a thin glass substrate is easy to break and is very difficult to wash or transport, and thus is difficult to use in the actual manufacturing process.

Patent Document 1 discloses a method (see FIG. 13) to bond a silicon wafer and a flexible substrate formed of glass, plastic, or the like having flexible characteristics, but even with this method, problems such as transferring being insufficient due to the substrate tearing off because of the difference in the coefficient of thermal expansion, and damaging of the glass substrate, and the like may occur.

RELATED ART DOCUMENTS

Non-Patent Documents

Non-Patent Document 1: SID06DIGEST p280-p282
Non-Patent Document 2: IDW09 p261-p264
Non-Patent Document 3: SID09DIGEST p866-p869
Non-Patent Document 4: SID11DIGEST p387-p388

Patent Document

Patent Document 1: Japanese Patent Application Laid-Open Publication No. 2009-194400 (Published on Aug. 27, 2009)

SUMMARY OF THE INVENTION

Problems to be Solved by the Invention

When a plastic substrate is used as a substrate with flexible characteristics, the substrate comes off during heat treatment and transfer cannot take place properly due to the difference in the coefficient of thermal expansion with the silicon wafer. Furthermore, in the case where a thin film glass substrate is used as a substrate with flexible characteristics, then there is a problem of being easily damaged during transportation and washing.

The present invention was made in view of the above-mentioned problems, and the aim thereof is to improve the manufacturing yield of a high performing and flexible semiconductor device.

Means for Solving the Problems

To solve the above-mentioned problems, a first method of manufacturing a semiconductor device of the present invention includes: implanting ions into a single-crystal semiconductor substrate to form a separation layer at a prescribed depth therein; forming an insulating substrate that includes a first substrate, a third substrate, and a second substrate disposed therebetween, the first substrate and the third substrate having a coefficient of thermal expansion similar to a coefficient of thermal expansion of the single-crystal semiconductor substrate, the insulating substrate having flexible characteristics; bonding the single-crystal semiconductor substrate to the insulating substrate such that the single-crystal semiconductor substrate and the first substrate are joined together; and forming a single-crystal semiconductor layer on the insulating substrate by separating a portion of the single-crystal semiconductor substrate from the separation layer through heat treatment.

According to the method of manufacturing mentioned above, a single-crystal semiconductor layer can be formed on top of an insulating substrate that is flexible, and thus it is possible to realize a high performing and flexible semiconductor device. Furthermore, as the second substrate is sandwiched between the first substrate and the third substrate, the single-crystal semiconductor layer and the first substrate both have a coefficient of thermal expansion that is similar to each other and can be bonded reliably. Furthermore, by reinforcing the first substrate and the third substrate with the second substrate, handling the first substrate and the second substrate will be easier during the manufacturing process. Also, by sandwiching both sides of the second substrate with the first substrate and the third substrate, warping of a substrate during heat treatment can be prevented, and thus transferring can be realized in a desired manner.

Thus, a semiconductor device that is high performing and flexible can be realized with ease, and the manufacturing yield can also be increased.

To solve the above-mentioned problems, a second method of manufacturing a semiconductor device of the present invention includes: implanting ions into a single-crystal semiconductor substrate to form a separation layer at a prescribed depth therein; forming an insulating substrate that includes a first substrate having flexible characteristics, a second substrate disposed on the first substrate, and a third substrate that is thicker than the first and second substrates disposed on the second substrate, the first substrate and third substrates having a coefficient of thermal expansion similar to a coefficient of thermal expansion of the single-crystal semiconductor substrate; bonding the single-crystal semiconductor substrate to the insulating substrate such that the single-crystal semiconductor substrate and the first substrate are joined together; forming a single-crystal semiconductor layer on the insulating substrate by separating a portion of the single-crystal semiconductor substrate from the separation layer through heat treatment; and removing the third substrate after forming the single-crystal semiconductor layer.

According to the second method of manufacturing, the same effect as the first method of manufacturing can be obtained, and in addition, as a step of removing the third substrate is included, the flexibility of the semiconductor device can be further increased.

In the second method of manufacturing, it is preferable that the third substrate be removed by radiating a laser beam on the third substrate from a side of the third substrate opposite to where the single-crystal semiconductor layer is formed.

In the second method of manufacturing described above, the insulating substrate may be formed of a plurality of the first substrates arranged in a row, the second substrate may be large enough to cover all the first substrates, and the third substrate may be the same size as the second substrate, and a plurality of single-crystal semiconductor substrates may be bonded to the insulating substrate so as to correspond to the respective first substrates, and the single-crystal semiconductor layer may be formed on the insulating substrate on the respective single-crystal semiconductor substrates by separating a portion of the respective single-crystal semiconductor substrates from the separation layer by heat treatment.

According to the method of manufacturing above, a plurality of semiconductor devices can be manufactured simultaneously by using a large single substrate (second substrate, third substrate), and thus the manufacturing cost of the semiconductor device can be reduced and the manufacturing yield thereof can be improved.

It is preferable that the second method of manufacturing include cutting the second substrate so as to correspond to the respective first substrates.

In the first and second method of manufacturing, it is preferable that the first substrate and the third substrate be glass substrates having flexible characteristics and the same coefficient of thermal expansion as each other.

In the first and second method of manufacturing, it is preferable that the second substrate be a plastic substrate having flexible characteristics and a coefficient of thermal expansion that is different from the coefficient of thermal expansion of the first substrate and the third substrate.

According to the method of manufacturing mentioned above, the first substrate and the third substrate are glass substrates, and in case the second substrate is a plastic substrate, then the plastic substrate is being sandwiched between the glass substrates, and thus the bending of the plastic substrate due to heat treatment can be suppressed.

In the first and second method of manufacturing mentioned above, it is preferable that the second substrate be formed of one or more layers of an organic material.

In the first and second method of manufacturing, it is preferable that the single-crystal semiconductor substrate be a single-crystal silicon wafer.

A semiconductor device according the present invention includes: an insulating substrate that includes a first substrate, a third substrate, and a second substrate disposed therebetween, the first substrate and the third substrate having a coefficient of thermal expansion similar to a coefficient of thermal expansion of the single-crystal semiconductor substrate, the insulating substrate having flexible characteristics; and a single-crystal semiconductor layer that is formed on the first substrate and that has a coefficient of thermal expansion similar to the coefficient of thermal expansion of the first substrate and the third substrate.

According to the configuration above, a semiconductor device that is high performing and flexible can be attained.

A semiconductor device according the present invention includes: an insulating substrate that includes a first substrate, a third substrate, and a second substrate having insulating characteristics disposed therebetween that has a different coefficient of thermal expansion from the first and third substrates, the first substrate and third substrates having a similar coefficient of thermal expansion, the insulating substrate having flexible characteristics; and a single-crystal semiconductor layer that is formed on the first substrate and that has a coefficient of thermal expansion similar to the coefficient of thermal expansion of the first substrate and the third substrate.

According to the configuration above, a semiconductor device that is high performing and flexible can be attained.

A display device of the present invention is provided with the semiconductor device mentioned above.

As a result, a high performing and flexible display device can be realized.

Effects of the Invention

As mentioned above, the method of manufacturing the semiconductor device of the present invention includes: forming an insulating substrate that is flexible and that includes a first substrate and a third substrate having a coefficient of thermal expansion that is similar to the coefficient of thermal expansion of the single-crystal semiconductor substrate, and a second substrate that is disposed between the first substrate and the third substrate; bonding the single-crystal semiconductor substrate and the insulating substrate so as to bond the single-crystal semiconductor substrate and the first substrate; bonding the single-crystal semiconductor substrate and the insulating substrate so as to bond the single-crystal semiconductor substrate and the first substrate; and forming a single-crystal semiconductor layer as a remaining portion of the single-crystal semiconductor substrate by separating a portion of the single-crystal semiconductor substrate from the separation layer through heat treatment.

As a result, the manufacturing yield of a semiconductor device that is high performing and flexible can be increased.

DETAILED DESCRIPTION OF EMBODIMENTS

<Embodiment 1>
(Configuration of Semiconductor Device)
A semiconductor device related to Embodiment 1 of the present invention will be explained using drawings.

Figure 1:
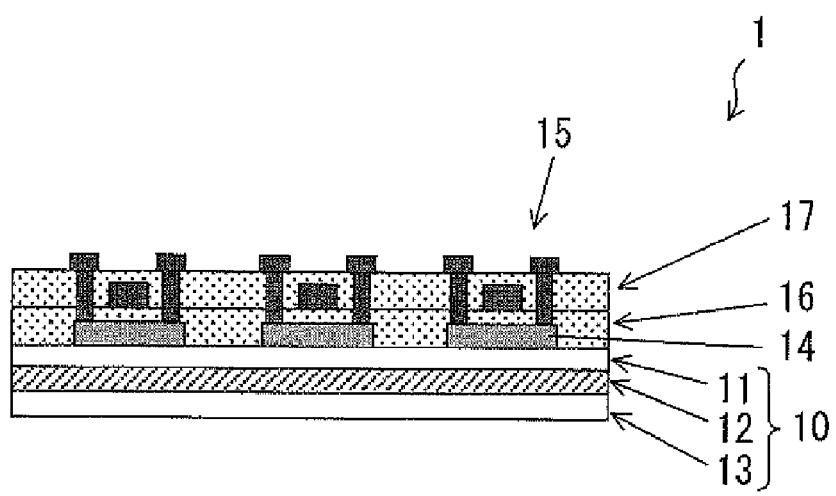
FIG. 1 is a cross-sectional view showing a schematic configuration of a semiconductor device related to Embodiment 1 of the present invention.

FIG. 1 is a cross-sectional view showing a schematic configuration of a semiconductor device 1 related to Embodiment 1 of the present invention.

The semiconductor device 1 includes an insulating substrate 10 having a first substrate 11, a second substrate 12, and a third substrate 13, and a single-crystal semiconductor layer 14 formed on top of the insulating substrate 10, thin-film transistors (TFTs) 15 formed on top of the single-crystal semiconductor layer 14, and a gate insulating film 16 and an interlayer insulating film 17 that cover the single-crystal semiconductor layer 14 and the thin-film transistors 15. The semiconductor device 1 is used as a display panel that is a part of an active matrix driving type display device, for example.

The insulating substrate 10 is formed of three layers, the first substrate 11, the second substrate 12, and the third substrate 13, and as a whole has flexible characteristics.

The first substrate 11 and the third substrate 13 are formed of a glass substrate, and are respectively formed to be thin so as to have flexible characteristics. The thickness of the first substrate 11 and the third substrate 13 is 100 μm or less, for example. Furthermore, the first substrate 11 and the third substrate 13 are both formed of the same material and have the same coefficient of thermal expansion (coefficient of thermal expansion for glass=3–4×10e–6). Furthermore, the coefficient of thermal expansion of the first substrate 11 and the third substrate 13 is similar to the coefficient of thermal expansion of the single-crystal semiconductor layer 14. The material used for the first substrate 11 and the third substrate 13 is not limited to glass as long as the coefficient of thermal expansion thereof is similar to the single-crystal semiconductor layer 14. Furthermore, the first substrate 11 and the third substrate 13 may use different materials. In other words, the coefficient of thermal expansion of the first substrate 11 and the third substrate 13 only needs to be similar to each other and also similar to the coefficient of thermal expansion of the single-crystal semiconductor layer 14.

The second substrate 12 is formed between the first substrate 11 and the third substrate, and is formed with a material having flexible characteristics. The second substrate 12 is formed of an organic material with one or more layers, and a plastic such as PI (polyimide), PET (polyethylene terephthalate), PES (polyether sulfone), or the like can be used. Furthermore, the second substrate 12 has a thickness of 50 um, for example, and the coefficient of thermal expansion is different from the coefficient of thermal expansion of the first substrate 11, the third substrate 13, and the single-crystal semiconductor layer 14. If the first substrate 11 and the third substrate are glass and the second substrate 12 is plastic, then the coefficient of thermal expansion of the second substrate 12 is greater than the coefficient of thermal expansion of the first substrate 11 and the third substrate 13. The material of the second substrate 12 is not limited to plastic, and may use a metallic foil of stainless steel (coefficient of thermal expansion=10×10e–6), or the like.

In this manner, the insulating substrate 10 that is a part of the semiconductor device 1 is formed by stacking the third substrate 13, the second substrate 12, and the first substrate 11 in that order. In other words, the insulating substrate 10 has a sandwich structure in which the second substrate 12 that is a plastic substrate is housed between the first substrate 11 and the third substrate 13 that are glass substrates, the insulating substrate 10 being flexible as a whole.

The single-crystal semiconductor layer 14 is formed (transferred) on top of the first substrate 11 of the insulating substrate 10, and is a single-crystal silicon (Si) layer, for example. As shown above, the coefficient of thermal expansion (the coefficient of thermal expansion of silicon (Si)=3.3×10e–6) of the single-crystal semiconductor layer 14 is similar to the coefficient of thermal expansion of the first substrate 11 and the third substrate 13, and is different from the coefficient of thermal expansion of the second substrate 12. The single-crystal semiconductor layer 14 is not limited to a single-crystal silicon layer, and may be a compound semiconductor (the coefficient of thermal expansion=5 to 6×10e–6) such as GaN, GaAs, or the like. A so-called SOI (silicon insulator) substrate is formed by the insulating substrate 10 and the single-crystal semiconductor layer 14.

The thin-film transistors 15 are formed on top of the single-crystal semiconductor layer 14. The thin-film transistor 15 has an ordinary structure having a gate electrode, a drain electrode, and a source electrode. The thin-film transistor 15 is a MOS type thin-film transistor (MOS transistor). The different kinds of MOS transistors include an N channel MOS transistor, a P channel MOS transistor, and a CMOS transistor that combines the two. The CMOS transistors are often used and have characteristics such as low power consumption and being able to operate with low voltage.

The gate insulating film 16 and the interlayer insulating film 17 are stacked in this order on top of the thin-film transistor 15. The gate insulating film 16 and the interlayer insulating film 17 are known configurations and thus the descriptions thereof are omitted.

The semiconductor device 1 having the configuration mentioned above has the single-crystal semiconductor layer 14 (single-crystal silicon thin film) formed on top of the insulating substrate 10 that is flexible, and can attain high performing thin film transistors, and thus can realize a high performing and flexible semiconductor device. Furthermore, by using this semiconductor device 1 for a display panel, a flexible display (flexible display device) can be realized.

Figure 2:
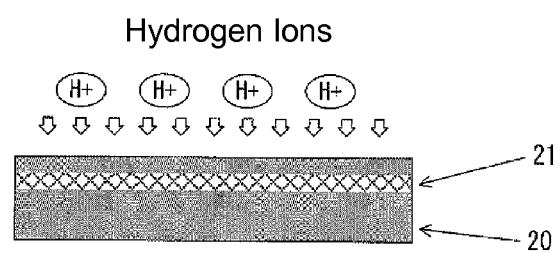
FIGS. 2(a) to 2(e) show the manufacturing steps of the semiconductor device shown in FIG. 1.
Figure 2:
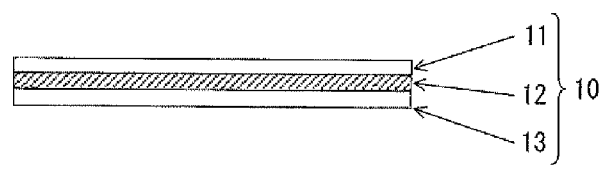
Figure 2:
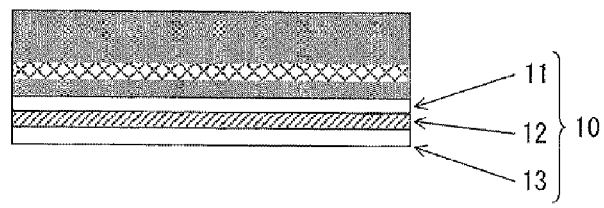
Figure 2:
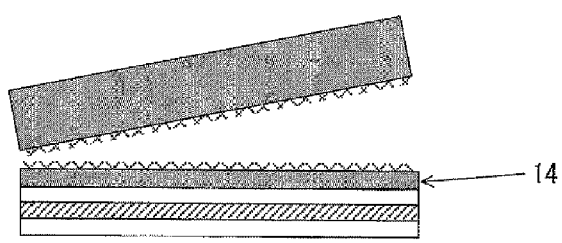
Figure 2:
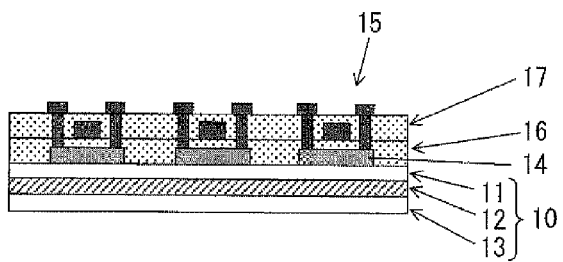

(Method of Manufacturing Semiconductor Device)
Next, a method of manufacturing (first method of manufacturing) the semiconductor device 1 will be described using FIG. 2 as a reference. FIG. 2 shows a method of manufacturing the semiconductor device 1. In the description given below, glass substrates are used for the first substrate 11 and the third substrate 13, and a polyimide substrate is used for the second substrate 12, as an example.

<1. Separation Layer Forming Process (FIG. 2(a))>

Hydrogen ions are injected into the single-crystal silicon wafer 20 (single-crystal semiconductor substrate), and a separation layer 21 (peeling layer) is formed at a prescribed depth (100 nm from the front surface, for example).

<2. Insulating Substrate Forming Process (FIG. 2(b))>

The insulating substrate 10 includes a glass substrate (first substrate 11) that is 50 um thick and a glass substrate (third substrate 13) that is 50 um thick having a coefficient of thermal expansion (3 to $4\times10e-6$) similar to the coefficient of thermal expansion ($3.3\times10e-6$) of the single-crystal silicon wafer 20, and the second substrate 12 that is formed of a 50 um thick polyimide that is disposed between the first substrate 11 and the third substrate 13. Specifically, the second substrate 12 is formed on top of the third substrate 13, and the first substrate 11 is formed on top of the second substrate 12.

<3. Substrate Bonding Process (FIG. 2(c))>

In order to bond the single-crystal silicon wafer 20 with the first substrate 11, the single-crystal silicon wafer 20 and the insulating substrate 10 are bonded to each other.

<4. Separation Process (FIG. 2(d))>

After the single-crystal silicon wafer 20 and the insulating substrate 10 are bonded to each other, by applying heat treatment at 450 C.°, for example, a portion of the single-crystal silicon wafer 20 is separated from the separation layer 21 where the hydrogen ions are injected, and a single-crystal silicon thin film 14 that is 150 nm thick is formed (transferred) on top of the first substrate 11 of the insulating substrate 10 as a remaining portion of the single-crystal silicon wafer 20. As a result, an SOI substrate is formed.

<5. TFT Forming Process (FIG. 2(e))>

The thin-film transistors 15, the gate insulating film 16, and the interlayer insulating film 17 are formed on top of the separated substrate (SOI substrate). A known technology can be used for forming the thin-film transistors 15. As a result, the high performing thin-film transistors 15 can be made on top of the flexible insulating substrate 10.

Through the steps mentioned above, the semiconductor device 1 that is high performing and is flexible can be manufactured. Furthermore, with the above-mentioned steps, the single-crystal silicon thin film 14 can be formed at a low temperature (600° C. or less).

(Configuration of Insulating Substrate)

Next, the results of studying the configuration of the insulating substrate 10 will be described. FIGS. 3(a) to 3(d) are figures that show sample configurations of the insulating substrate, and each figure shows the single-crystal silicon wafer (including the single-crystal silicon thin film) that is transferred to the insulating substrate.

The insulating substrate shown in FIG. 3(a) is only formed of plastic substrates. According to this configuration, the coefficient of thermal expansion of the plastic substrate and the coefficient of thermal expansion of the single-crystal silicon wafer are largely different (specifically, the coefficient of thermal expansion of the plastic substrate>the coefficient of thermal expansion of the single-crystal silicon wafer), and thus during the heat treatment in the <4. Separation Process (FIG. 2(d))>, it is difficult to reliably transfer the single-crystal silicon thin film, and there is a risk that the substrate may come off after transferring.

Figure 3:
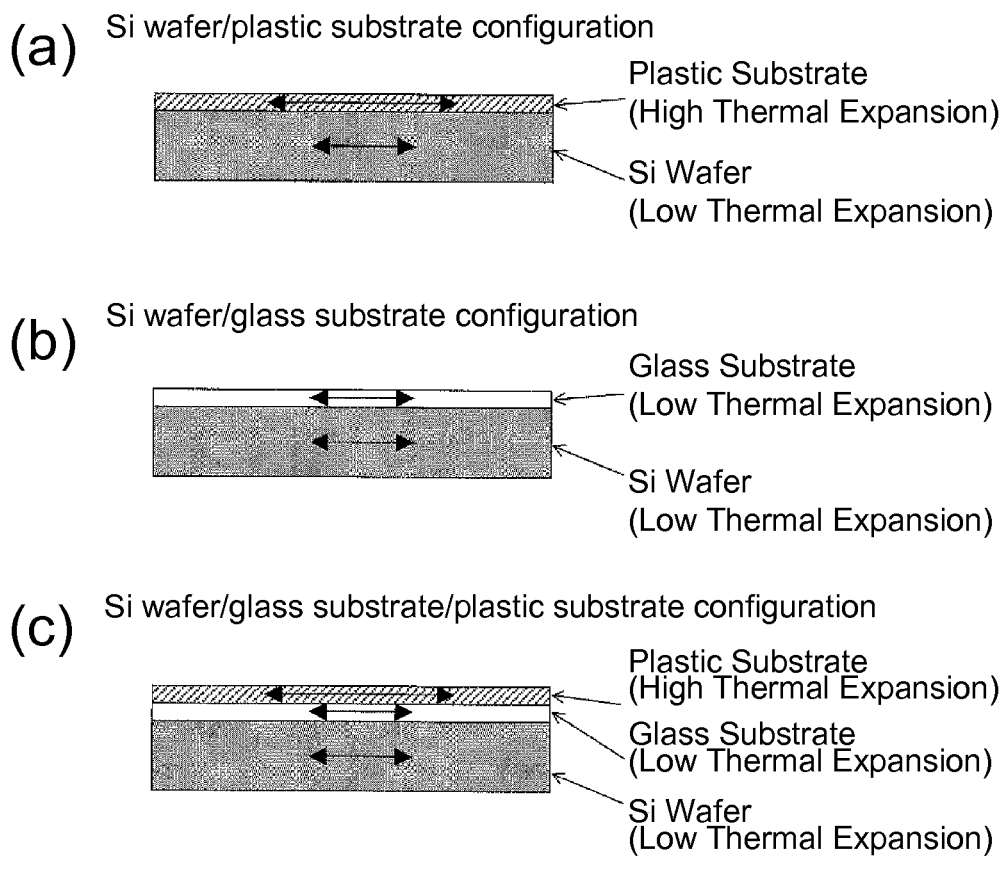
FIGS. 3(a) to 3(d) show a configuration example of the insulating substrate.

The insulating substrate shown in FIG. 3 (b) is only formed of glass substrates. According to this configuration, the coefficient of thermal expansion (3 to $4\times10e-6$) of the glass substrate and the coefficient of thermal expansion ($3.3\times10e-6$) of the single-crystal silicon wafer are similar, and thus the substrate coming off and the like can be prevented. However, if the glass substrate is made so as to be flexible, the glass substrate becomes very easy to break, and the manufacturing yield decreases. Also, handling the glass substrate during the manufacturing process becomes difficult.

The insulating substrate shown in FIG. 3(c) is formed of a plastic substrate and a glass substrate, and a single-crystal silicon wafer if transferred on top of the glass substrate. According to this configuration, even if the glass substrate is thin enough to be flexible, by reinforcing the rear side of the plastic substrate, the glass substrate can become harder to break. However, the coefficient of thermal expansion of the plastic substrate and the coefficient of thermal expansion of the glass substrate are largely different (specifically, the coefficient of thermal expansion of the plastic substrate >the coefficient of thermal expansion of the glass substrate), and there is a risk that the substrate may come off during the heat treatment in the <4. Separation Process (FIG. 2(d))>.

The insulating substrate shown in FIG. 3(d) is equivalent to the insulating substrate 10 of the present embodiment, and has a sandwiching structure in which the plastic substrate is sandwiched between the two glass substrates, and the single-crystal silicon wafer is transferred to the top of the glass substrate. According to this configuration, the two glass substrates can be reinforced with the plastic substrate, and thus the glass substrates can be thin enough to be flexible. Furthermore, by having a sandwiching structure, during the heat treatment in the above-mentioned <4. Separation Process (FIG. 2(d))>, deformations such as the plastic substrate bending or the substrate coming off due to the different coefficient of thermal expansion can be prevented.

As mentioned above, the semiconductor device 1 related to the present Embodiment has a structure in which a plastic substrate is sandwiched by thin glass substrates, and thus the single-crystal silicon thin film (single-crystal silicon wafer) and the glass substrate that have similar coefficients of thermal expansion can be bonded in a desired manner. Furthermore, by reinforcing the glass substrate with a plastic substrate, handling the glass substrate during the manufacturing process becomes easier. Furthermore, by sandwiching both sides of the plastic substrate between the glass substrates using the same material, the substrate can be prevented from bending due to heat treatment, and thus transferring can be realized in a desired manner.

Thus, a semiconductor device and a display (display device) that are high performing and flexible can be realized with ease, and the manufacturing yield can also be increased.

<Embodiment 2>

(Configuration of Semiconductor Device)

A semiconductor device related to Embodiment 2 of the present invention will be explained using drawings. In the descriptions below, the main differences between the semiconductor devices related to Embodiment 1 and Embodiment 2 will be described, and the respective constituting elements that have the same function will be given the same reference character and the description thereof will be omitted.

Figure 4:
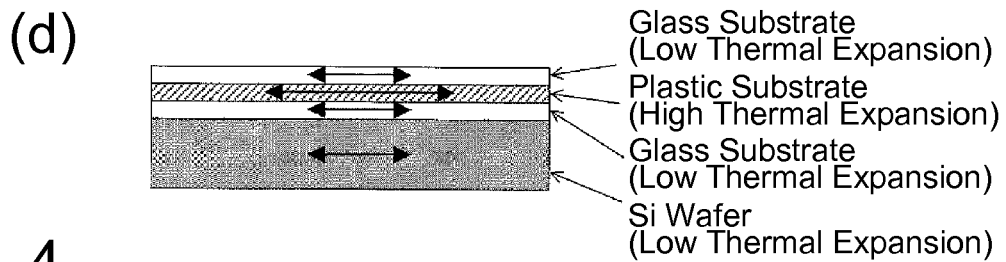
FIG. 4 is a cross-sectional view showing a schematic configuration of a semiconductor device related to Embodiment 2 of the present invention.
Figure 4:
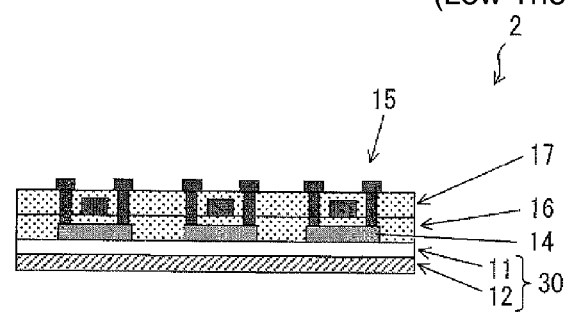

FIG. 4 is a cross-sectional view showing a schematic configuration of a semiconductor device 2 related to Embodiment 2 of the present invention.

The semiconductor device 2 includes: a first substrate 11 and a second substrate 12 that form an insulating substrate 30; a single-crystal semiconductor layer 14 formed on top of the insulating substrate 30; thin-film transistors 15 formed on top of the single-crystal semiconductor layer 14; and a gate insulating film 16 and an interlayer insulating film 17 that cover the single-crystal semiconductor layer 14 and the thin-film transistors 15.

The insulating substrate 30 is formed of two layers, the first substrate 11 and the second substrate 12, the insulating substrate 30 having flexible characteristics as a whole.

The first substrate 11 is a glass substrate that is formed thin enough to be flexible. The thickness of the first substrate 11 is 100 um or less, for example. Furthermore, the coefficient of thermal expansion of the first substrate 11 is similar to that of the single-crystal semiconductor layer 14. The material for the first substrate 11 is not limited to glass as long as the coefficient of thermal expansion is similar to that of the single-crystal semiconductor layer 14.

The second substrate 12 is formed on top of the first substrate 11, and is formed with a material having flexible characteristics. The second substrate 12 has a thickness of 50 um, for example, and has a coefficient of thermal expansion that is different from the coefficient of thermal expansion of the first substrate 11 and the single-crystal semiconductor layer 14. If the first substrate 11 is glass and the second substrate 12 is plastic, then the coefficient of thermal expansion of the second substrate 12 is greater than the coefficient of thermal expansion of the first substrate 11. The material used for the second substrate 12 is not limited to a plastic, and may be a metallic foil of stainless-steel and the like.

In this manner, the insulating substrate 30 that is a part of the semiconductor device 2 is formed by the first substrate 11 and the second substrate 12 being layered, and the insulating substrate 30 has flexible characteristics as a whole.

The single-crystal semiconductor layer 14 is formed (transferred) on top of the first substrate 11 of the insulating substrate 30, and is a single-crystal silicon layer, for example. As mentioned above, the coefficient of thermal expansion of the single-crystal semiconductor layer 14 is similar to the coefficient of thermal expansion of the first substrate 11, and is different from the coefficient of thermal expansion of the second substrate 12. The single-crystal semiconductor layer 14 is not limited to a single-crystal silicon layer, and may be a compound semiconductor such as GaN, GaAs, or the like, for example. An SOI substrate is formed of the insulating substrate 30 and the single-crystal semiconductor layer 14.

The semiconductor device 2 having the configuration mentioned above has the single-crystal semiconductor layer 14 (single-crystal silicon thin film) formed on top of the insulating substrate 30 that is flexible, and can attain high performing thin film transistors, and thus can realize a high performing and flexible semiconductor device. Furthermore, by using this semiconductor device 2 for a display panel, a flexible display (flexible display device) can be realized.

(Method of Manufacturing Semiconductor Device)

Figure 5:
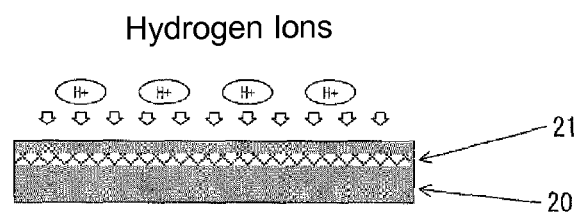
FIGS. 5(a) to 5(f) show the manufacturing steps of the semiconductor device shown in FIG. 4.
Figure 5:
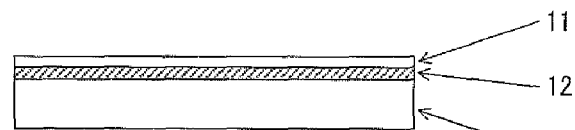
Figure 5:
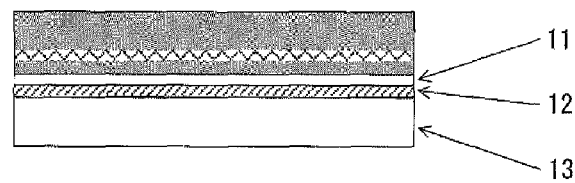
Figure 5:
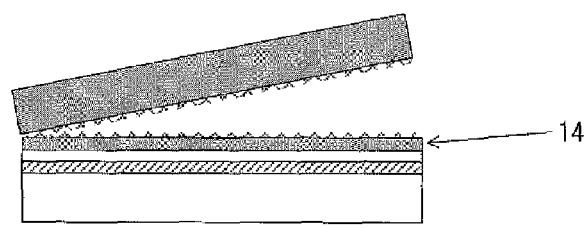
Figure 5:
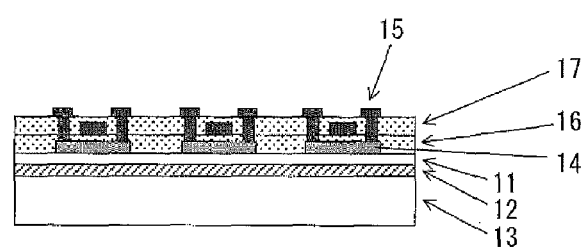
Figure 5:
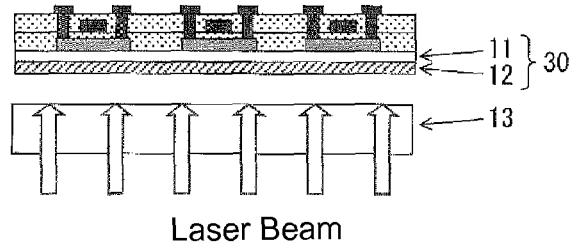

Next, a method of manufacturing (second method of manufacturing) the semiconductor device 2 will be described using FIG. 5 as a reference. FIG. 5 shows a method of manufacturing the semiconductor device 2. In the description below, a case in which a glass substrate was used as the first substrate 11, and a polyimide substrate was used as a second substrate 12 is used as an example.

<1. Separation Layer Forming Process (FIG. 5(a))>

Hydrogen ions are injected into the single-crystal silicon wafer 20 (single-crystal semiconductor substrate), and a separation layer 21 (peeling layer) is formed at a prescribed depth (100 nm from the front surface, for example).

<2. Insulating Substrate Forming Process (FIG. 5(b))>

An insulating substrate is formed, the insulating substrate including: a glass substrate (first substrate 11) that is 50 um thick and a glass substrate (third substrate 13) that is 700 um thick, the glass substrates having a coefficient of thermal expansion (3 to 4×10e−6) that is similar to a coefficient of thermal expansion (3.3×10e−6) of the single crystal silicon wafer 20; and the second substrate 12 that is 50 um thick and made of a polyimide and that is disposed between the first substrate 11 and the third substrate 13. Specifically, the second substrate 12 is formed on top of the third substrate 13, and the first substrate 11 is formed on top of the second substrate 12. The preferred thickness of the glass substrate (third substrate 13) is 500 to 700 um.

<3. Substrate Bonding Process (FIG. 5(c))>

In order to bond the single-crystal silicon wafer 20 with the first substrate 11, the single-crystal silicon wafer 20 and the insulating substrate are bonded to each other.

<4. Separation Process (FIG. 5(d))>

After the single-crystal silicon wafer 20 and the insulating substrate are bonded to each other, by performing a heat treatment of 450 C.°, for example, a portion of the single-crystal silicon wafer 20 is separated from the separation layer 21 in which hydrogen ions are injected, and a single-crystal silicon thin film 14 that is 130 nm thick is formed (transferred) as a remaining portion of the single-crystal silicon wafer 20 on top of the first substrate 11 of the insulating substrate. As a result, an SOI substrate is formed. A film thickness of approximately 50-300 nm for the single-crystal silicon thin film 14 is preferable.

<5. TFT Forming Process (FIG. 5(e))>

The thin-film transistor 15, the gate insulating film 16, and the interlayer insulating film 17 are formed on top of the separated substrate (SOI substrate). A known technology can be used for forming the thin-film transistor 15. As a result, the high-performance thin-film transistor 15 can be formed on top of the insulating substrate that is flexible.

<6. Separation Process of Glass Substrate (FIG. 5(f))>

After the thin-film transistor 15 is formed, a laser beam is radiated from the rear side of the insulating substrate, thus lowering the adhesion between the second substrate 12 and the third substrate 13, and removing the third substrate 13 from the second substrate 12. As a result, the insulating substrate 30 with two layers including the first substrate 11 and the second substrate 12 is formed.

Through the steps mentioned above, the semiconductor device 2 that is flexible can be manufactured. Furthermore, with the above-mentioned steps, the single-crystal silicon thin film 14 can be formed at a low temperature (600° C. or less).

(Configuration of Insulating Substrate)

Figure 6:
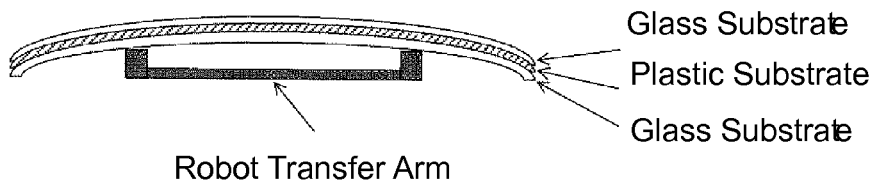
FIGS. 6(a) to 6(b) show a configuration example of the insulating substrate.
Figure 6:
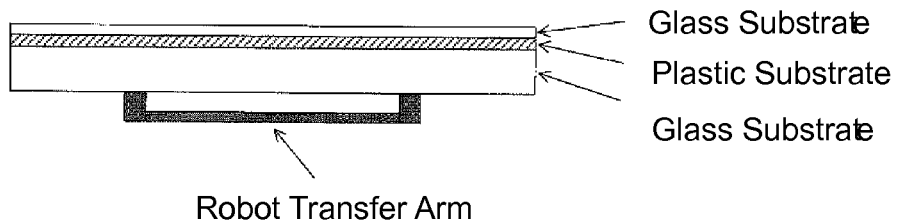

Next, the results of studying the configuration of the insulating substrate 30 will be described. FIGS. 6(a) and 6(b) show a configuration example of the insulating substrate. The insulating substrate shown in FIG. 6 shows the insulating substrate that is formed in the <2. Insulating Substrate Forming Process (FIG. 5(b))>.

The insulating substrate shown in FIG. 6(a) has a structure including two glass substrates that are approximately equally thin and that sandwich a plastic substrate. This structure can be used as a flexible semiconductor device with a three layers structure, but if the substrate size becomes large, then the substrate is easily warped by the weight thereof, and this may cause problems such as the substrate being damaged when being transported on a robot transfer arm and the like, for example.

The insulating substrate shown in FIG. 6(b), which corresponds to the insulating substrate 30 of the present embodiment, is thick enough that the glass substrate on the side of the insulating substrate not in contact with the single-crystal silicon wafer will not be warped by the weight thereof when mounted on a robot transfer arm. As a result, problems during the transportation of the substrate can be avoided and the manufacturing yield of the semiconductor device can be improved.

Furthermore, flexibility cannot be obtained with this kind of three layer structure, and after the devices such as the thin-film transistors are formed, the glass substrate (third substrate) that is not in contact with the single-crystal silicon wafer is removed (<6. Glass Substrate Separation Process (FIG. 5(f))>).

Thus, flexibility can be attained by forming the insulating substrate so as to have two layers including the glass substrate (first substrate) and the plastic substrate (second substrate). As for a method to remove the glass substrate, a light such as a laser can be radiated to weaken the bonding strength of the glass substrate and the plastic substrate in order to remove the glass substrate, for example.

As mentioned above, the semiconductor device 2 related to the present embodiment can prevent transport failure due to the substrate warping. As a result, an even larger area of the substrate can be used, and in addition to improving the manufacturing yield of the semiconductor devices that are high performing and flexible, the semiconductor device and the display device using the semiconductor device can have reduced cost.

(Modification Examples of Method of Manufacturing Semiconductor Device)

Next, modification examples of a method of manufacturing (second method of manufacturing) the semiconductor device 2 will be described.

In order to further reduce the manufacturing cost of the semiconductor device 2, it is preferable that a plurality of single-crystal silicon wafers be transferred to a large single substrate, and that a plurality of semiconductor devices 2 be manufactured simultaneously.

This kind of method of manufacturing includes: (i) a method (hereinafter, Modification Example 1) in which only the glass substrate (third substrate) that is not in contact with the single-crystal silicon wafer is made larger (larger area), (ii) a method (Modification Example 2) in which two layers, the glass substrate (third substrate) that is not in contact with the single-crystal silicon wafer and the plastic substrate (second substrate), are both made larger (larger area), (iii) a method (Modification Example 3) in which three layers, the glass substrate (third substrate) that is not in contact with the single-crystal silicon wafer, the plastic substrate (second substrate), and the glass substrate (first substrate) that is in contact with the single-crystal silicon wafer, are made larger (larger area).

Figure 7:
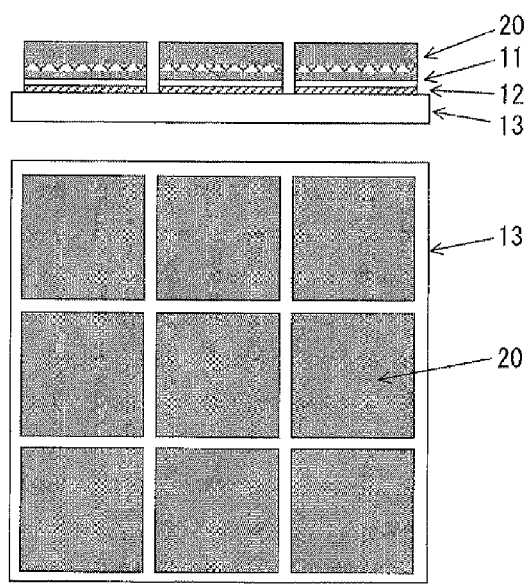
FIG. 7 shows Modification Example 1 of method of manufacturing a semiconductor device related to Embodiment 2.
Figure 8:
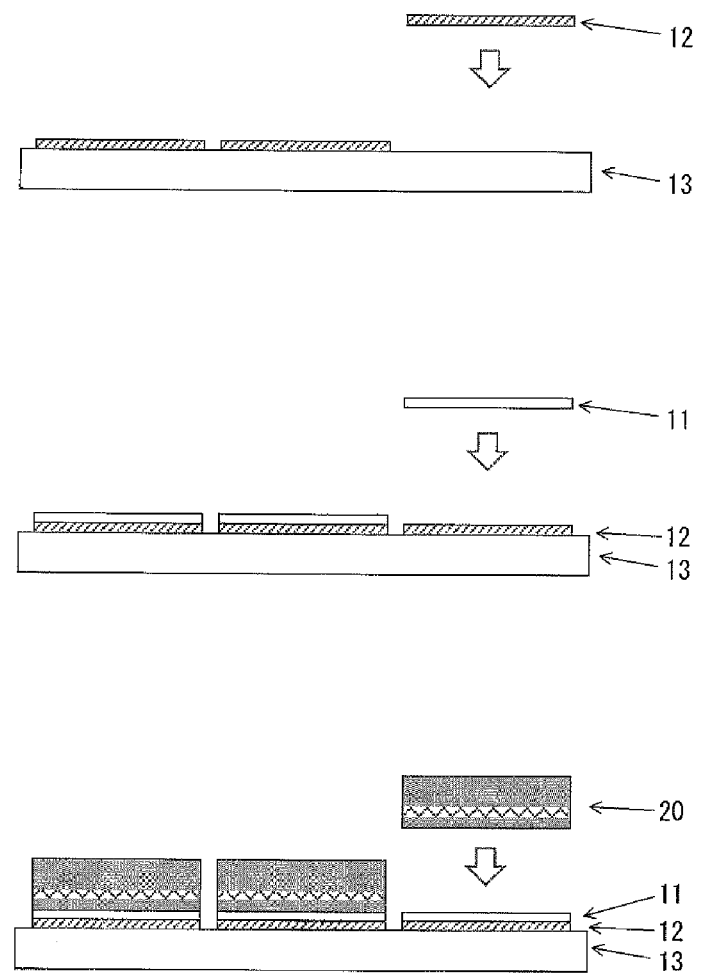
FIG. 8 shows Modification Example 1 of the method of manufacturing a semiconductor device related to Embodiment 2.

FIGS. 7 and 8 are figures that show the method of manufacturing for Modification Example 1. As shown in FIGS. 7 and 8, on top of the glass substrate 13 (third substrate) that has a large area and that is thick, a plurality of the plastic substrates 12 (second substrates), a plurality of thin glass substrates 11 (first substrates), and a plurality of single-crystal silicon wafers 20 are individually formed so as to correspond to the respective semiconductor devices 2 (in this case, nine).

Figure 9:
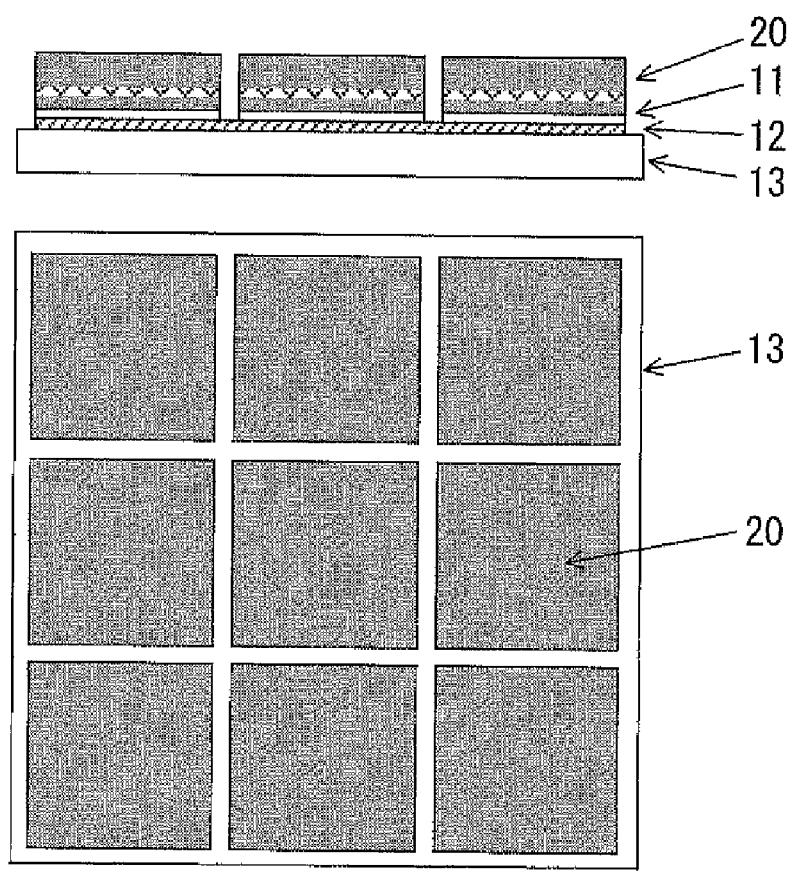
FIG. 9 shows Modification Example 2 of the method of manufacturing a semiconductor device related to Embodiment 2.
Figure 10:
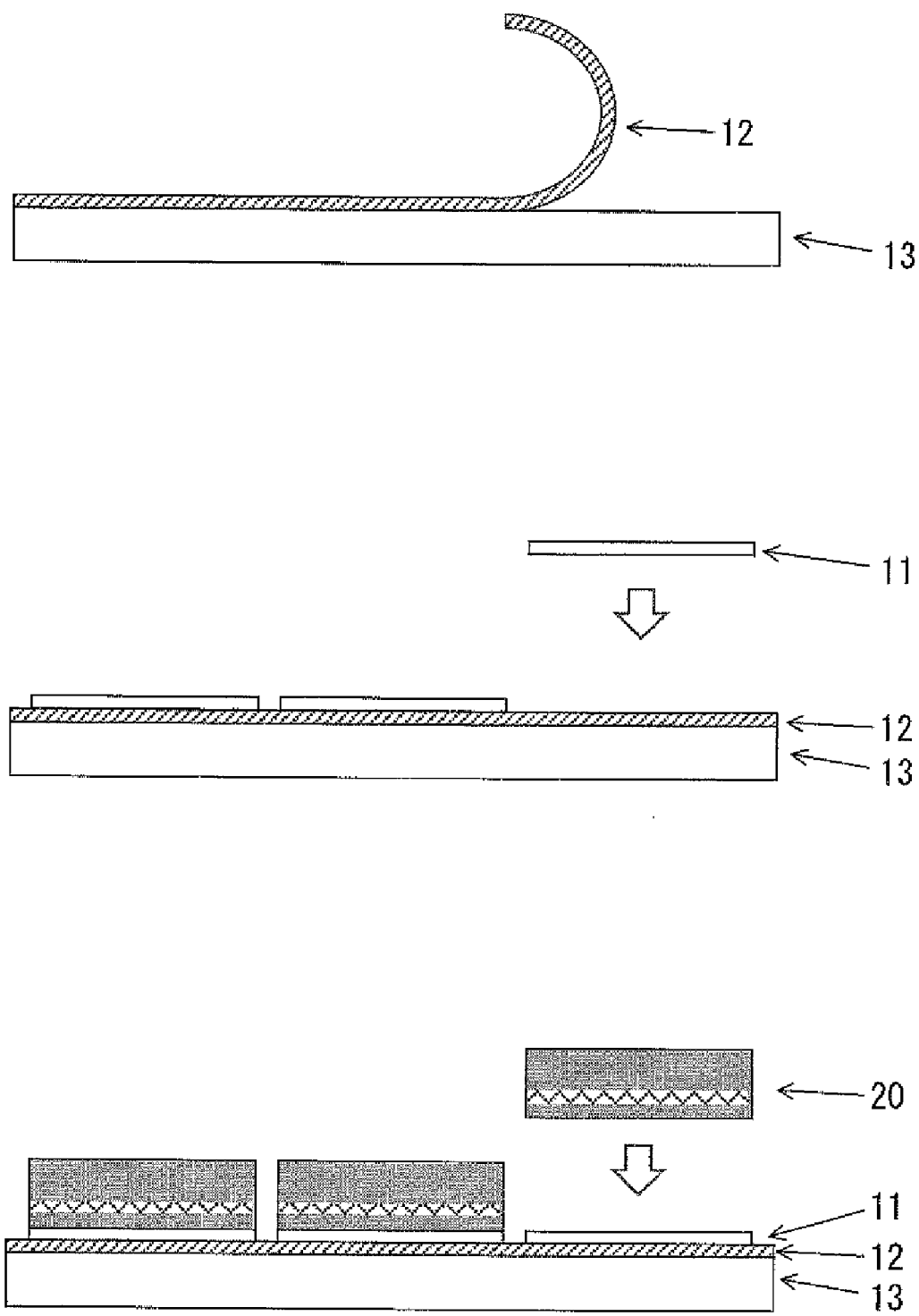
FIG. 10 shows Modification Example 2 of the method of manufacturing a semiconductor device related to Embodiment 2.

FIGS. 9 and 10 are figures that show the method of manufacturing for Modification Example 2. As shown in FIGS. 9 and 10, on top of the glass substrate 13 (third substrate) that has a large area and that is thick, the plastic substrate 12 (second substrate) that has the same area as the glass substrate 13 is formed, and on top of the plastic substrate 12 with a large area, a plurality of thin glass substrates 11 (first substrates), and a plurality of single-crystal silicon wafers 20 are individually formed so as to correspond with the respective semiconductor devices 2 (in this case, nine). In Modification Example 2, after the glass substrate (third substrate) is removed, a plurality of semiconductor devices 2 are manufactured by cutting the plastic substrate (second substrate) so as to correspond to the respective glass substrates (first substrates).

Figure 11:
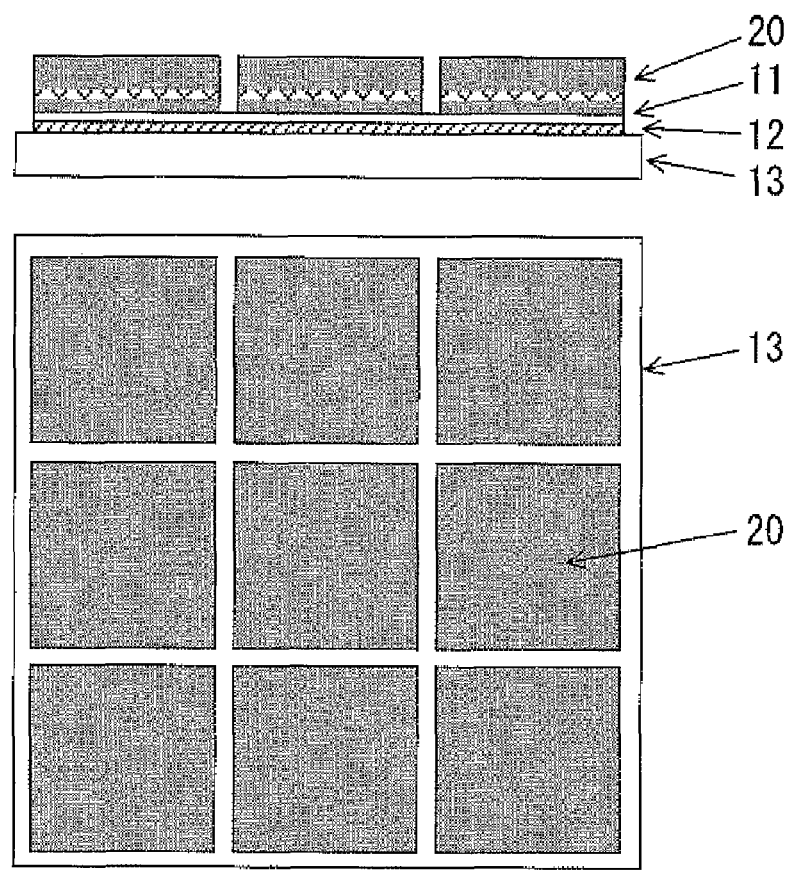
FIG. 11 shows Modification Example 3 of the method of manufacturing a semiconductor device related to Embodiment 2.
Figure 12:
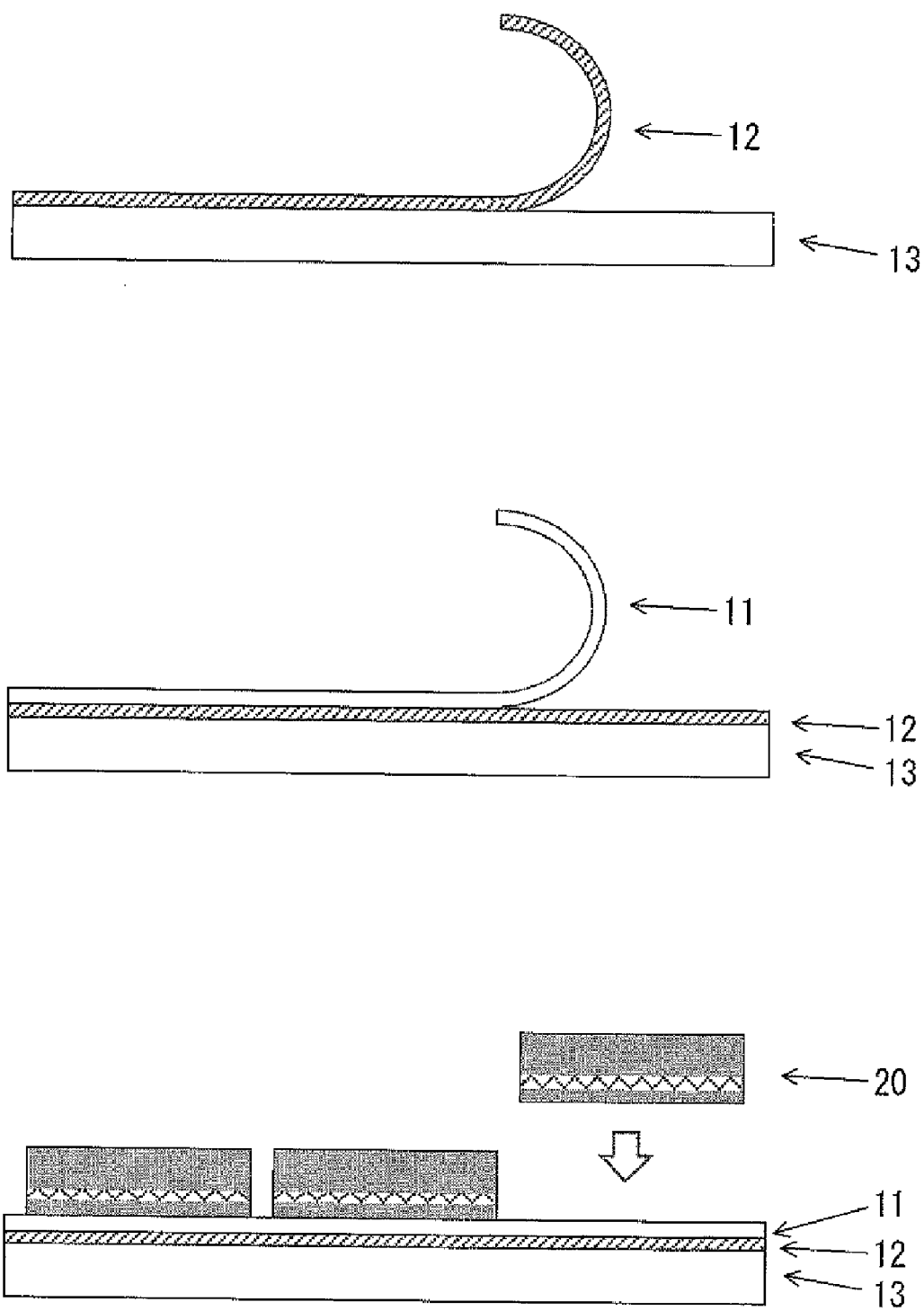
FIG. 12 shows Modification Example 3 of the method of manufacturing a semiconductor device related to Embodiment 2.
Figure 13:
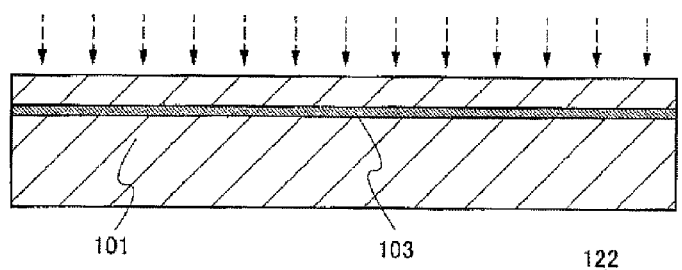
FIG. 13 shows a method of manufacturing a conventional semiconductor device.
Figure 13:
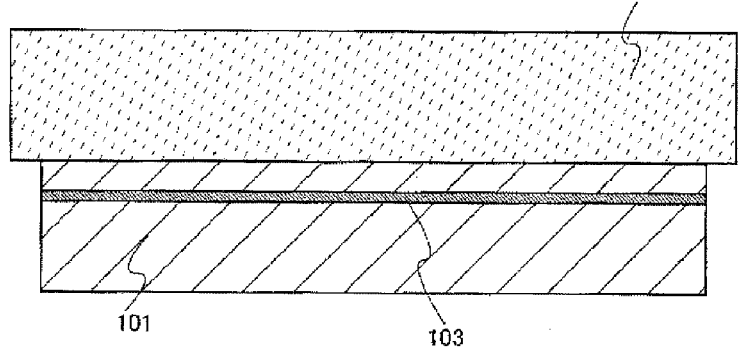
Figure 13:
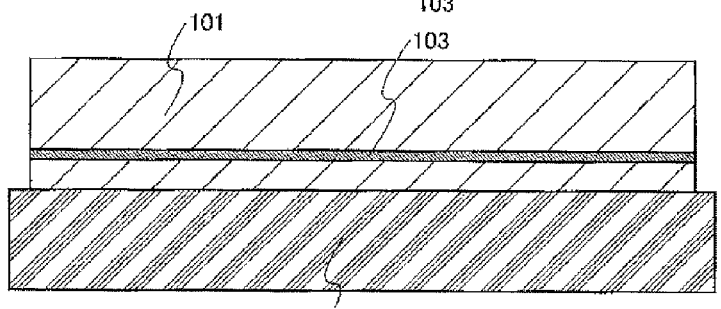
Figure 13:
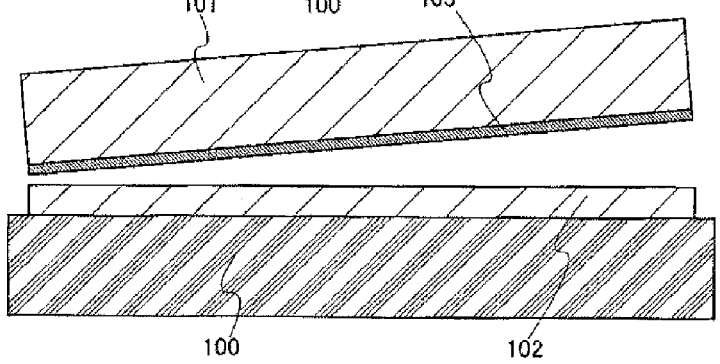

FIGS. 11 and 12 are figures that show the method of manufacturing for Modification Example 3. As shown in FIGS. 11 and 12, on top of the glass substrate 13 (third substrate) that has a large area and that is thick, the plastic substrate 12 (second substrate) that has the same area as the glass substrate 13 and the glass substrate 11 (first substrate) that has the same area and that is thin are formed in this order. On top of the insulating substrate that is large in area and that has a three layer structure, a plurality of single-crystal silicon wafers 20 are individually formed so as to correspond to respective semiconductor devices 2 (in this case, nine).

Furthermore, in the Modification Examples 1 to 3, the large single substrate 13 (third substrate) is removed by radiating a laser beam to the rear surface during the <6. Separation Process of Glass Substrate (FIG. 5(f))>.

According to Modifications Examples 1 to 3 of the method of manufacturing, by using the large single substrate 13, a plurality of the semiconductor devices 2 can be formed simultaneously, and thus the manufacturing cost can be reduced and the manufacturing yield can be improved.

Here, bonding the three substrates accurately becomes more difficult as the size of the substrate becomes larger. Furthermore, the thin glass substrate, in particular, becomes easier to be damaged as the size thereof increases. Thus, as shown in Modification Examples 1 and 2, it is preferable that the thick glass substrate 13 (third substrate) that will be the base have a large enough area so that a plurality of single-crystal silicon wafers 20 can be mounted, and the thin glass substrates 11 (first substrates 11) be similarly small as the single-crystal silicon wafers 20. As a result, attaching the thin glass substrates 11 together becomes easier, and the manufacturing yield of the semiconductor device 2 can be improved. In this case, the size of the plastic substrate 12 (second substrate) can be larger than or similar to the single-crystal silicon wafer.

The present invention is not limited to the above-mentioned embodiments, and various modifications can be made without departing from the scope of the claims. That is, embodiments obtained by combining techniques modified without departing from the scope of the claims are also included in the technical scope of the present invention.

INDUSTRIAL APPLICABILITY

The present invention is preferable for displays such as television.

DESCRIPTION OF REFERENCE CHARACTERS 1, 2 semiconductor device
10 insulating substrate
11 first substrate
12 second substrate
13 third substrate
14 single-crystal semiconductor layer (single-crystal silicon thin film)
15 thin film transistor (TFT)
16 gate insulating film
17 interlayer insulating film
20 single-crystal silicon (Si) wafer
21 separation layer (peeling layer)
30 insulating substrate

What is claimed is:

1. A method of manufacturing a semiconductor device, comprising:
   implanting ions into a single-crystal semiconductor substrate to form a separation layer at a prescribed depth therein;
   forming an insulating substrate that includes a first substrate, a third substrate, and a second substrate disposed therebetween, the first substrate and the third substrate having a coefficient of thermal expansion similar to a coefficient of thermal expansion of said single-crystal semiconductor substrate, the insulating substrate having flexible characteristics;
   bonding the single-crystal semiconductor substrate to the insulating substrate such that the single-crystal semiconductor substrate and the first substrate are joined together; and
   forming a single-crystal semiconductor layer on the insulating substrate by separating a portion of the single-crystal semiconductor substrate from the separation layer through heat treatment.

2. The method of manufacturing a semiconductor device according to claim 1, wherein the first substrate and the third substrate are glass substrates having flexible characteristics and the same coefficient of thermal expansion as each other.

3. The method of manufacturing a semiconductor device according to claim 1, wherein the second substrate is a plastic substrate having flexible characteristics and a coefficient of thermal expansion that is different from the coefficient of thermal expansion of the first substrate and the third substrate.

4. The method of manufacturing a semiconductor device according to claim 3, wherein the second substrate is formed of one or more layers of an organic material.

5. The method of manufacturing a semiconductor device according to claim 1, wherein the single-crystal semiconductor substrate is a single-crystal silicon wafer.

6. A method of manufacturing a semiconductor device, comprising:
   implanting ions into a single-crystal semiconductor substrate to form a separation layer at a prescribed depth therein;
   forming an insulating substrate that includes a first substrate having flexible characteristics, a second substrate disposed on the first substrate, and a third substrate that is thicker than the first and second substrates disposed on the second substrate, the first substrate and third substrates having a coefficient of thermal expansion similar to a coefficient of thermal expansion of said single-crystal semiconductor substrate;
   bonding the single-crystal semiconductor substrate to the insulating substrate such that the single-crystal semiconductor substrate and the first substrate are joined together;
   forming a single-crystal semiconductor layer on the insulating substrate by separating a portion of the single-crystal semiconductor substrate from the separation layer through heat treatment; and
   removing the third substrate after forming the single-crystal semiconductor layer.

7. The method of manufacturing a semiconductor device according to claim 6, wherein the third substrate is removed by radiating a laser beam on the third substrate from a side of the third substrate opposite to where the single-crystal semiconductor layer is formed.

8. The method of manufacturing a semiconductor device according to claim 7, wherein the insulating substrate is formed of a plurality of the first substrates arranged in a row, the second substrate that is large enough to cover all the first substrates, and the third substrate that is the same size as the second substrate,
   wherein a plurality of single-crystal semiconductor substrates are bonded to the insulating substrate so as to correspond to the respective first substrates, and
   wherein the single-crystal semiconductor layer is formed on the insulating substrate on the respective single-crystal semiconductor substrates by separating a portion of the respective single-crystal semiconductor substrates from the separation layer by heat treatment.

9. The method of manufacturing a semiconductor device according to claim 8, further comprising:
   cutting the second substrate so as to correspond to the respective first substrates.

10. The method of manufacturing a semiconductor device according to claim 6, wherein the first substrate and the third substrate are glass substrates having flexible characteristics and the same coefficient of thermal expansion as each other.

11. The method of manufacturing a semiconductor device according to claim 6, wherein the second substrate is a plastic substrate having flexible characteristics and a coefficient of thermal expansion that is different from the coefficient of thermal expansion of the first substrate and the third substrate.

12. The method of manufacturing a semiconductor device according to claim 6, wherein the single-crystal semiconductor substrate is a single-crystal silicon wafer.

* * * * *